United States Patent [19]
Moncrieff

[11] Patent Number: 5,837,940
[45] Date of Patent: Nov. 17, 1998

[54] CONDUCTIVE SURFACE AND METHOD WITH NONUNIFORM DIELECTRIC

[76] Inventor: J. Peter Moncrieff, 408 Mason Rd., Vista, Calif. 92084

[21] Appl. No.: 854,583

[22] Filed: May 12, 1997

Related U.S. Application Data

[63] Continuation of Ser. No. 441,523, May 15, 1995, abandoned.

[51] Int. Cl.⁶ ...................................................... H01B 7/08
[52] U.S. Cl. ...................... 174/117 F; 174/268; 174/107; 361/313
[58] Field of Search ............................... 174/36, 107, 108, 174/110 R, 115, 68.3, 268, 102 SP, 117 F, 117 FF; 361/311, 312, 313

[56] References Cited

U.S. PATENT DOCUMENTS

| | | | |
|---|---|---|---|
| 937,435 | 10/1909 | Guay | 174/111 |
| 2,566,335 | 9/1951 | Joerren | 174/111 X |
| 3,309,455 | 3/1967 | Mildner | 174/29 X |
| 3,586,757 | 6/1971 | Haldeman, Jr. | 174/117 FF |
| 3,666,877 | 5/1972 | Arnandin, Jr. et al. | 174/115 X |
| 3,726,005 | 4/1973 | Prostor | 174/111 X |
| 4,045,750 | 8/1977 | Marshall | 333/6 X |
| 4,157,452 | 6/1979 | Pignataro et al. | 174/36 |
| 4,332,976 | 6/1982 | Hawkins | 174/107 |
| 5,171,938 | 12/1992 | Katsumata et al. | 174/36 |
| 5,192,834 | 3/1993 | Yamanishi et al. | 174/111 X |
| 5,239,134 | 8/1993 | Pote et al. | 174/102 R |
| 5,262,593 | 11/1993 | Madry et al. | 174/111 X |
| 5,523,534 | 6/1996 | Meister et al. | 174/36 |

*Primary Examiner*—Kristine L. Kincaid
*Assistant Examiner*—Chau N. Nguyen

[57] ABSTRACT

A nonuniform dielectric is located proximate to a conductive surface, the dielectric being substantially nonuniform with respect to the surface area of that conductive surface. If there are plural closely spaced conductors in a structure, then the nonuniform dielectric is located outside the space between these closely spaced conductors. Making the proximate dielectric nonuniform instead of uniform can provide advantages in better electrical performance for the proximate conductor.

5 Claims, 4 Drawing Sheets

CONDUCTIVE SURFACE AND METHOD WITH NONUNIFORM DIELECTRIC

This is a continuation of application Ser. No. 08/441,523, filed 1995, May 15, now abandoned.

BACKGROUND OF THE INVENTION

1. Field of Invention

This invention pertains to the surfaces of conductors and proximate dielectrics.

2. Description of Prior Art

When a dielectric is applied proximate to a conductor, prior art has generally employed a dielectric that is substantially uniform over a given surface of the conductor. This dielectric has been substantially uniform, in characteristics such as composition and thickness, with respect to the area of a given conductor surface.

Prior art has had several reasons for employing a uniform dielectric. For example, it is more economical, when a dielectric is being applied, to apply it in a substantially uniform manner. It would be superfluously expensive to employ special tooling and manufacturing processes to deliberately introduce specific nonuniformities.

Prior art has recognized that an electrical device, which can be generically called a structure for carrying electricity, may comprise a single, substantially isolated conductor (e.g a single conductor in open space or air, perhaps supported to be a substantial distance from any other conductor). Alternatively or additionally, an electrical device or structure for carrying electricity may comprise a plurality of closely spaced conductors or conductor elements (e.g. as in a capacitor, or a capacitor functioning as a transmission line or strip line or cable, or as in an electrical cable generally). To determine whether a particular conductor is substantially isolated or closely spaced relative to another conductor, prior art has employed recognized criteria. For example, two conductors or conductor elements have been regarded as closely spaced if there is substantial capacitance between them, if the pair have a well defined characteristic impedance, or if the electric field established by one conductor has a substantial electrical influence upon the other conductor. Conversely, a conductor is substantially isolated if there is not substantial capacitance between it and another conductor of interest, or if the electric field from this conductor does not have a substantial electrical influence upon another conductor of interest. The art recognizes the fact that electrical influence from an electric field can include electrostatic and/or electromagnetic phenomena. For example, the shield or shields of a cable are generally closely spaced to the inner conductor, whereas an amplifier's metal chassis is substantially isolated from the multitude of various wires and component parts constituting the amplifier's circuitry. For a second example, the art recognizes the fact that the essence of an inductive coil or transformer requires a conductor system comprising at least two closely spaced conductors or conductor elements, appropriately mutually disposed so that the electric field established by one conductor or conductor element has a substantial electrical influence upon the other conductor or conductor element; in order to provide a conventional coil that opposes change in electric current, these two closely spaced conductors can then simply be electrically interconnected appropriately (e.g. in series, head to tail). For the sake of volumetric and manufacturing efficiency, this series, head to tail electrical interconnection between the two closely spaced conductors or conductor elements could be conveniently provided by a mutual extension of the two conductors or conductor elements, doubling back upon themselves in helical form and electrically interconnecting. It is noted that the present invention does not limit the manner of electrical interconnection (if any) between plural closely spaced conductors or conductor elements. Prior art has recognized that these criteria, for determining whether plural conductors are closely spaced, might be relative to the application employing the conductors. For example, these criteria might be relative to the electrical wavelength, frequency, or current involved in the application employing the conductors, and/or relative to the operating characteristics of the circuit or electrical device employing the conductors (characteristics such as impedance, gain, bandwidth, noise, manner of electrical connection, and usage of a conductor within a circuit), and/or relative to the scale of the dimensions and distances within an electrical device (for example, given the scale of an integrated circuit device, there could be within its confines both substantially isolated conductors, to carry electricity from one section to another, and also closely spaced conductors, for example to constitute a capacitive strip line or an explicit capacitor). The art recognizes the fact that plural closely spaced conductors or conductor elements could be part of a conductor system, as for example in an electrical device or structure for carrying electricity, and that this conductor system might comprise any number of conductors or conductor elements, geometrically mutually disposed in various manners known to the art, and interconnected or joined, electrically and/or mechanically, in various manners known to the art.

In the case where a structure for carrying electricity comprises plural distinct conductors that are closely spaced, prior art has specifically taught that electrical performance parameters (e.g. impedance, propagation velocity, high frequency attenuation) depend on the nature of only that dielectric situated between conductors, and do not depend on the nature of any dielectric situated outside the space between conductors. For example, consider an extended capacitor functioning as a transmission line (whose entire utility and advantage intrinsically depends on its distributed capacitance), particularly in the form of a coaxial cable, where one conductor substantially encloses or surrounds another conductor. Prior art specifically teaches that this cable's electrical performance parameters such as impedance, propagation velocity, and high frequency attenuation are determined entirely by the dimensions of the two conductors and the relative permittivity of only the inside dielectric situated between these two conductors; the nature of any dielectric situated outside the outer conductor is not a factor in any of these equations taught by prior art. Moreover, prior art specifically teaches that the electric field carried by a coaxial cable exists entirely inside the outer conductor, with no field existing outside the outer conductor; thus, by the teachings of prior art, the nature of any dielectric situated outside the outer conductor cannot affect or be affected by the electric field carried by the coaxial cable. Moreover, prior art specifically teaches that a coaxial cable can be placed directly adjacent to foreign conductors and/or dielectrics, without any adverse effects upon performance, since the electric field carried by the cable does not exist outside the outer conductor.

Thus, prior art specifically teaches that the nature of a dielectric outside a coaxial cable does not affect the electrical performance of this capacitor in the form of a cable, of this structure for carrying electricity, regardless of whether that dielectric is uniform or nonuniform. A coaxial cable is in fact a coaxial capacitor, and a rolled capacitor is also a substantially coaxial capacitor, with the outermost circumferential turn of the outermost plate being equivalent to the enclosing outermost conductor of a coaxial cable. Thus, by these teachings of prior art, the nature of the dielectric outside the outermost enclosing closely spaced conductor of any coaxial or rolled capacitor should not affect the electrical performance of that capacitor.

Similar considerations apply to a flat plate capacitor, wherein prior art teaches that all of the charge/discharge displacement current occurs between closely spaced facing plates, with no electrical field outside the outermost plates, just as with a coaxial cable. Thus prior art teaches that the dielectric between closely spaced plate pairs affects electrical performance, but that the nature of the dielectric outside each pair of closely spaced plate conductors, or outside the outermost plates, does not affect the capacitor's electrical performance. For example, it has been the deliberate practice of prior art to employ an electrically superior dielectric material inside the intraplate space between facing plate pairs in a stacked flat plate capacitor, but to employ an electrically inferior dielectric material outside this intraplate space, both outside the flat plate stack as a whole, and even within the stack for alternating dielectric layers that are not inside the intraplate space between facing plate pairs.

The above specific teachings have taught prior art that the nature of the outer dielectric of a coaxial cable or capacitor, situated outside the enclosing (or outermost) closely spaced conductor (or conductors), cannot influence the electrical performance, so there could not possibly be any electrical performance advantage to making this outer dielectric nonuniform. Thus, even though prior art has employed nonuniform dielectrics (e.g. air with spacers) inside the space between closely spaced conductors, in order to provide an electrically superior dielectric and thereby secure electrical performance advantages in accordance with the teachings of prior art, by these same teachings of prior art there has been no reason to employ electrically superior dielectrics outside the space between closely spaced conductors, or outside an enclosing closely spaced conductor. Thus, prior art has designed such outer dielectrics solely on the basis of economy, convenience, protective ability, etc., and all these factors dictate a substantially uniform dielectric. And therefore, prior art has been limited to employing substantially uniform dielectrics outside the space between closely spaced conductors, or outside an enclosing closely spaced conductor. It would be contrary to the explicit teachings of prior art, and it would be unobvious in light of these teachings, to employ a nonuniform dielectric outside the space between closely spaced conductors, with the utility of providing electrical performance advantages.

In sum, prior art has specifically taught and practiced that the quality and nature (e.g. nonuniformity) of a dielectric outside the space between plural closely spaced conductors cannot be important. This also logically implies that prior art has taught that at least some aspects (e.g. nonuniformity) of the quality and nature of a dielectric outside a single substantially isolated conductor cannot be important, since any real single conductor can be considered to be a multilayer plural conductor with layers at different depths (and this in fact is how electricity and electric fields flow through a single conductor, with different behavior at different layers of depth within that concutor). Thus, with respect to single conductors that are substantially isolated, prior art has enclosed these only with substantially uniform dielectrics.

Some prior art has shown a nonuniform dielectric proximate to a single conductor, but only as a partial fractional detail of a specific teaching of a larger structure as the minimum essential working part, wherein this single conductor is closely spaced to and is substantially enclosed by a second conductor, the shown nonuniform dielectric thus serving exclusively as a spacing dielectric between two closely spaced conductors, and thus being located between two closely spaced conductors and furthermore inside an outer enclosing closely spaced conductor. This partial fractional detail, shown as a nonuniform dielectric proximate to a single conductor, has not been taught to have any utility or advantage in itself by this prior art. The minimum essential working part having operability, as taught by this prior art, comprises the closely spaced outer enclosing conductor, as well as the single inner conductor and nonuniform dielectric. Thus, the single inner conductor shown in prior art's partial detail drawing is not in fact a substantially isolated conductor, and furthermore prior art's minimum essential working part locates the nonuniform dielectric inside the space enclosed by the outer closely spaced conductor.

It is noted that prior art has employed ornamental designs on the outside of electrical devices such as cables and capacitors, such ornamental designs comprising indicia and color coding patterns for the sole purpose of product identification. However, prior art has not taught any utility nor any electrical performance advantage for such ornamental designs. Furthermore, the elements constituting such ornamental designs, such as inks and pigments, are recognized by the art as structurally distinct from dielectrics, dielectrics being the element taught and claimed by the present invention. Similarly, it is noted that prior art has employed adhesives, brackets, and other external means for mounting, supporting, or attaching electrical devices such as cables and capacitors to the external world. However, prior art has taught that the only utility of such external attaching means is for attaching the electrical devices such as cables and capacitors. Furthermore, the art recognizes that such attaching means are structurally external to and distinct from electrical devices themselves, such as taught and claimed by the present invention.

Contrary to prior art, it has now been experimentally determined and demonstrated that a nonuniform dielectric can provide electrical performance advantages over a uniform dielectric. Furthermore, it has now been experimentally determined and demonstrated that a nonuniform dielectric can provide electrical performance advantages over a uniform dielectric, when that nonuniform dielectric is located proximate to a single conductive surface, or is located proximate to a surface of a single, substantially isolated conductor, or is located outside the space between plural closely spaced conductors. It has been experimentally determined and demonstrated that, contrary to the explicit teachings of prior art, the quality of a dielectric, situated outside the space between plural closely spaced conductors, can affect the electrical performance of those conductors, and that a nonuniform dielectric or a higher quality dielectric can improve the electrical performance of those conductors.

OBJECTS AND ADVANTAGES

Accordingly, it is an object of the present invention to dispose a dielectric proximately to a conductor surface so that the dielectric is nonuniform with respect to the area of the conductor surface.

It has now been experimentally determined and demonstrated that superior performance can be realized for some conductors and conductor systems, in various electrical devices and structures for carrying electricity, when proximate dielectrics are made substantially nonuniform with respect to a given conductive surface of a conductor or conductor system (such a conductor system possibly including plural conductor elements, which might be joined or interconnected in various manner known to the art).

The conductor's electrical performance with a nonuniform proximate dielectric can be demonstrably superior to that with a uniformly applied dielectric, and even superior to that with no applied dielectric at all (which is equivalent to a uniformly applied dielectric of air or space).

There might be several reasons for the demonstrably superior performance of the present invention.

Dielectric materials have a property called dielectric absorption, by which they inertially smear in time the electrical performance of any proximate conductor. A uniform application of a dielectric material to the surface of a conductor establishes such degradation over the entire surface of the conductor, and applies the maximum amount possible of such degradation inducing material over the surface. It could be better to apply a minimum amount of dielectric proximate to the conductor surface, as could be achieved by applying the dielectric nonuniformly.

An electromagnetic wave travels primarily outside a conductor, and the electrical or electromagnetic fields for a current in a conductor exist primarily outside that conductor. This wave or field is degraded and/or slowed where it penetrates into a conductor, and is at its most pristine and/or fastest outside a conductor's surface. Thus, it is particularly important not to slow and/or degrade this wave at its most pristine and fastest by applying a maximum amount of dielectric outside of and proximate to the surface of a conductor, as would result from a uniform application. It could be better to apply a minimum amount of dielectric proximate to the conductor surface, as could be achieved by applying the dielectric nonuniformly.

Conductor performance could also suffer if no dielectric material is employed proximate to a conductor's surface, e.g. if air (or open space, even in the form of a vacuum) were employed as the dielectric uniformly applied to a conductor's surface. There may be several reasons for this. For a first example, the propagation velocity of an electromagnetic wave is higher just outside the surface of a conductor than just within the conductor, and this mismatch could produce dispersion or temporal incoherence in an electrical signal propagating along a conductor. Based on principles recognized by the art, it can be appreciated that such mismatches could also produce unwanted refraction of the electromagnetic wave at the boundary between the conductor and any enclosing dielectric, changing the direction of the electromagnetic wave, thus causing further penetration by the electromagnetic wave, and thereby disadvantageously making the electromagnetic wave more susceptible to degradation by the conductor and its imperfections. It could be better to slightly slow the wave propagation just outside the surface to better match the wave propagation just within the conductor, by employing a minimal amount of dielectric material, employed nonuniformly and perhaps in a deliberate pattern, proximate to the conductor's surface. For a second example, such mismatches might cause the electromagnetic wave to be reflected from any ends or edges of the conductor surface, thus producing standing waves, or standing waves might result from continuous paths around a conductor surface. It could be better to damp or terminate these reflections and standing waves, by employing a minimal amount of dielectric material, applied nonuniformly and perhaps in a deliberate pattern proximate to the conductor's surface.

It is hypothesized that suitably applied nonuniform instances or patterns of dielectric material could effectively slow down or terminate electromagnetic wave or field propagation along the surface of a conductor or conductor system, or could better match the external propagation speed of this wave outside the conductive surface to the wave's speed within the conductor or conductor system, or could damp, terminate, or break up reflections or standing wave patterns within, and/or across the surface of, a conductor or conductor system.

Likewise, based on general principles recognized by the art, lessening a mismatch, by employing an intermediate means having intermediate electrical properties, could lessen the undesirable effects of such a mismatch, for example better matching propagation speeds, thereby lessening refraction, and thereby lessening the electromagnetic wave's penetration of and degradation by the conductor and proximate dielectrics. Thus, in accordance with the present invention, a nonuniform dielectric, employed as an intermediary between a conductor and a uniform proximate dielectric, or between two proximate uniform dielectrics, could advantageously act as a buffer or virtual transformer, to lessen a disadvantageous mismatch, between the conductor and the uniform proximate dielectric, and/or between the two proximate uniform dielectrics, for the electromagnetic wave. As discussed above, lessening a mismatch could also beneficially reduce reflections and standing waves, within the conductor itself as well as within any electrically polarizable proximate dielectrics. For a first example (as discussed above; also see FIGS. 1a–1c below), if the conductor is uncovered, it could be advantageous to add a nonuniform dielectric proximate to this conductor's surface, thus lessening the mismatch from the surrounding air dielectric to the conductor. For a second example (see discussion for FIG. 1d below), if the conductor is covered or requires covering by a proximate uniform dielectric, it could be advantageous to provide a nonuniform dielectric on one side and/or the other side of this uniform dielectric, or adjacent to this uniform dielectric, thus lessening the mismatch from the surrounding air to or through the uniform dielectric, and thence to the proximate conductor. Similarly, for a third example (see discussion for FIG. 1d below), since the surrounding air itself is a uniform dielectric, it logically follows that it could be advantageous to provide a nonuniform dielectric between any two uniform dielectrics proximate to a conductor, thus lessening the mismatch from one uniform dielectric to or through the other uniform dielectric, and thence to the proximate conductor.

Selective application of a dielectric in a nonuniform manner across a given surface can be demonstrably superior to uniform application of that same dielectric across that same surface, perhaps because a uniform application interferes too much with the electromagnetic wave or field's propagation, for example by slowing the wave down too much and failing to achieve optimal amelioration of a mismatch, or by imposing too much dielectric absorption by the dielectric material. Thus, for example, a selective, nonuniform dielectric application might damp or terminate specific wave propagation modes and directions (including directions due to refraction) optimally to ameliorate a mismatch, while imposing a minimum amount of degradation from the dielectric material's dielectric absorption properties.

Further objects and advantages of the present invention will become apparent from a consideration of the drawings and ensuing description of preferred embodiments.

DESCRIPTION OF PREFERRED EMBODIMENTS

FIGS. 1a–1e show some possible embodiments of the present invention, as employed proximate to a single conductor in open space or air, i.e. a substantially isolated conductor. A portion of the length of this conductor is shown in perspective view.

Figure 1A:
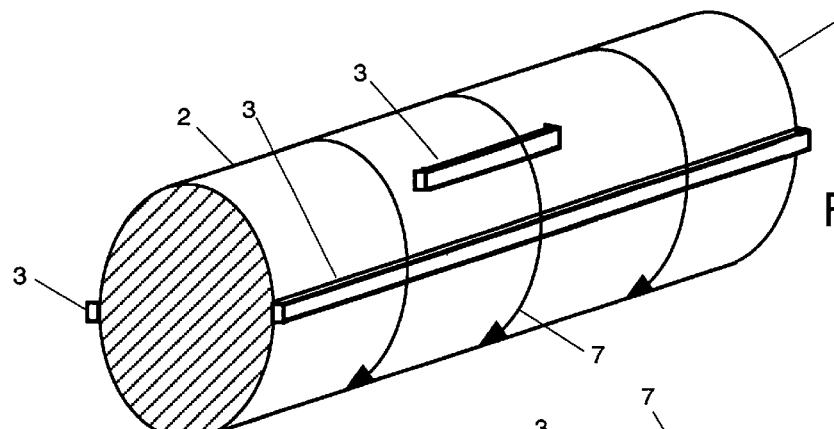
FIGS. 1a–1c show applications of the present invention to a round conductor, in perspective view.
Figure 1B:
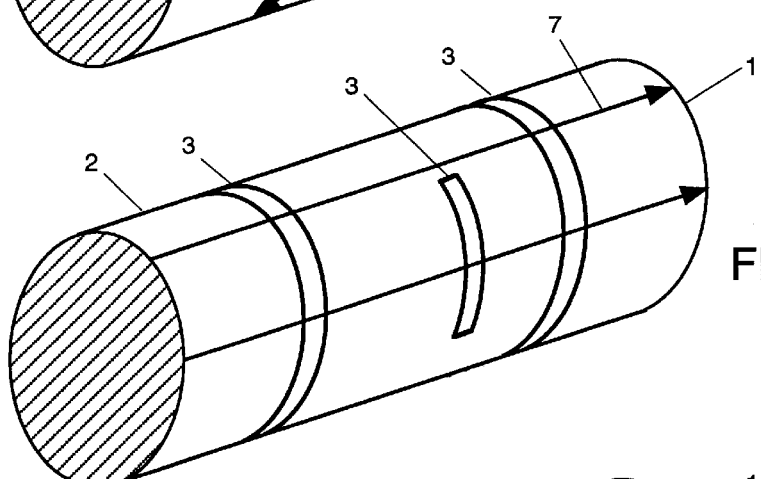
Figure 1C:
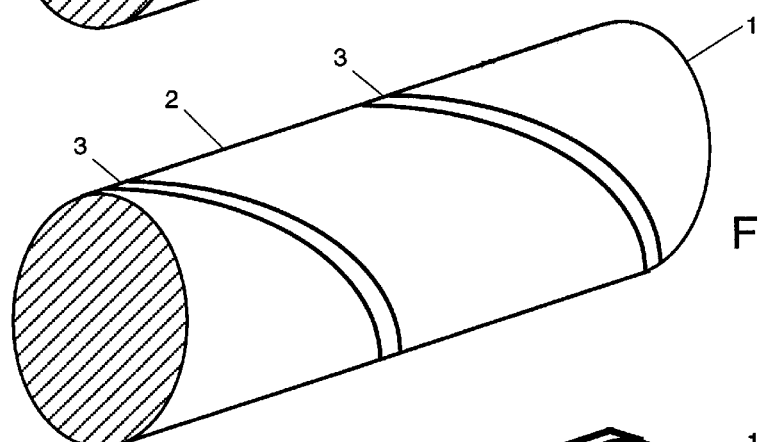

In FIGS. 1a–1c, a conductor 1 is shown as having a circular cross section. Conductor 1 could be solid or hollow in manners known to the art; it will be shown as solid in the drawings. Conductor 1 has a surface 2, whose shape in the FIGS. 1a–1e examples is a cylinder. A dielectric 3 is employed proximate to surface 2 of conductor 1, nonuniformly with respect to the area of surface 2.

Dielectric 3 could be said to be proximate to surface 2 if it is adjacent to or is near to surface 2. Dielectric 3 can still be proximate to surface 2 if another structural element intervenes and prevents them from being physically adjacent. Dielectric 3 could be considered to be near and proximate to surface 2 of conductor 1 so long as dielectric 3 can have a substantial influence on the electrical performance of conductor 1.

Dielectric 3 could be said to be nonuniform with respect to the area of surface 2 if some parts of the area of surface 2 differ from other parts of the area of surface 2 in proximity to dielectric 3, or in being proximate to a different amount of dielectric 3, or in being proximate to a different composition of dielectric 3.

A dielectric is a material higher in electrical resistivity than a conductor. In accordance with the present invention, any material may be employed for dielectric 3, so long as it is higher in resistivity than the material employed for conductor 1. For example, it has been experimentally determined and demonstrated that performance advantages can be obtained for conductor 1 when the material employed for dielectric 3 comprises a material normally classified as a dielectric, or a semiconductor, or a high resistivity conductor, or an organic substance, or a metal salt or metal compound. Different materials employed for nonuniform dielectric 3 have different effects upon the electrical performance of conductor 1, for example because different materials have different properties in absorbing or affecting the electromagnetic wave or field propagating just outside the surface 2 of conductor 1, to which dielectric 3 is proximate.

In FIG. 1a, dielectric 3 is shown as having the 23 length straight ridge, running along the length of conductor 1, i.e. along one dimension of surface 2. There could be a plurality of such ridges, arranged around the circumference of conductor 1 at uniform or nonuniform intervals. The cross sectional shape of the ridge of dielectric 3 could be approximately rectangular as shown, or approximately semicircular, or any other shape. Different ridges of dielectric on the same conductor surface could have different overall shapes (some straight, others curved) and dimensions. Some such ridges might run the entire length of conductor—while others might run only part of the length, and might be positioned at strategic uniform or nonuniform intervals along the length, and might be overlapping or not overlapping. Different ridges might comprise different materials.

Each instance of a nonuniform dielectric in accordance with the present invention, such as dielectric 3, could have a particular, predesigned, different shape and/or dimensions and/or location. One object of such possible variations could be to tune some properties of dielectric 3 (for example its electromagnetic wave absorption) with respect to the surface of a conductor, so as to optimize the performance of that conductor for a particular application of that conductor. The shape, dimensions, location, and material of each instance of nonuniform dielectric could be critical parameters to optimize, in order to realize the full advantages of a nonuniform dielectric in accordance with the present invention.

As is shown and discussed for the FIG. 1a example (and other figures below), nonuniform dielectric 3 could be nonuniform with respect to proximate conductive surface 2 by virtue of several possible criteria. Nonuniform dielectric 3 could be nonuniform by virtue of being present at some locations with respect to the surface area of conductive surface 2 and absent at other locations. Alternatively or additionally, nonuniform dielectric 3 could be nonuniform by virtue of being employed in different shapes and/or dimensions at plural distinct locations with respect to conductive surface 2. Alternatively or additionally, nonuniform dielectric 3 could be nonuniform by virtue of having varying proximity to conductive surface 2 at different locations with respect to the surface area of conductive surface 2 (see also FIGS. 3d, 3f, 3g for examples). Alternatively or additionally, nonuniform dielectric 3 could be nonuniform by virtue of employing different material composition at distinct locations with respect to conductive surface 2. Alternatively or additionally, nonuniform dielectric 3 could be nonuniform by virtue of having different thicknesses at distinct locations with respect to the area of conductive surface 2 (see also FIGS. 3f, 3g for examples).

In FIG. 1a, a plurality of arrows 7 illustrate one possible direction of electromagnetic wave or field that might be effectively slowed, damped, and/or terminated by nonuniform dielectric 3. In FIG. 1b, dielectric 3 is shown as having the form of a circular ridge, running around the circumference of conductor 1, i.e. along the other dimension of surface 2. There could be one such ridge, or a plurality of ridges, arranged along the length of conductor 1 at uniform or nonuniform intervals. The cross sectional shape of each ridge could be any shape. Different ridges of dielectric on the same conductor surface could have different overall shapes and dimensions. Some such ridges might run the entire circumference of conductor 1—while others might run only part of the circumference, and might be positioned at strategic uniform or nonuniform intervals along the circumference, and might be overlapping or not overlapping.

In FIG. 1b, a plurality of arrows 7 illustrate one possible direction of electromagnetic wave or field that might be effectively slowed, damped, and/or terminated by nonuniform dielectric 3.

In FIG. 1c, dielectric 3 is shown as having the form of a ridge or ridges that run diagonally across both dimensions of surface 2 of conductor 1. In this case, since surface 2 has the shape of a cylinder, a diagonal ridge across this surface could take the form of a helix. The same possible variations for dielectric 3 discussed for FIGS. 1a and 1b also obviously apply here to FIG. 1c.

Figure 1D:
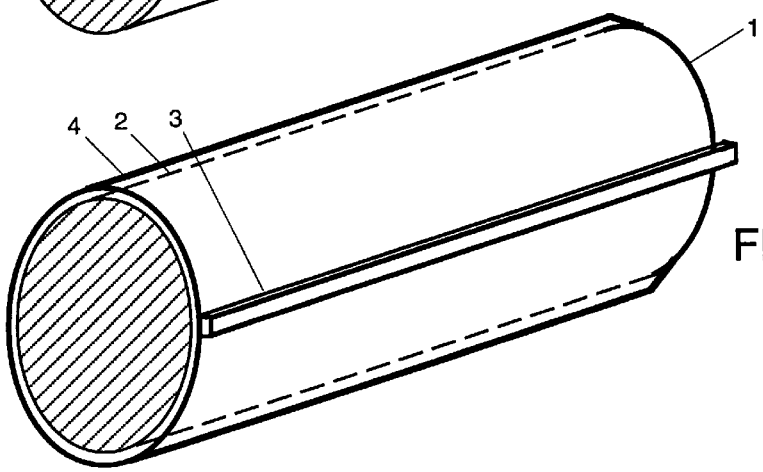
FIG. 1f shows an application of the present invention to a round cable, in perspective view.

In FIG. 1d, a second dielectric 4 is shown employed proximate to surface 2 of conductor 1. FIG. 1d shows an example of one possible configuration, with dielectric 4 applied uniformly with respect to surface 2, and adjacent to surface 2, thereby making dielectric 3 proximate to surface 2 but not adjacent to surface 2. Nonuniform dielectric 3 might be optimized for its wave absorbing properties, in accordance with the present invention, while uniform dielectric 4 might be a minimal coating applied sufficiently to secure any desired electrical insulation for the whole conductor. In the FIG. 1d example, both dielectrics 3 and 4 are shown as portions of dielectric located proximate to conductor 1; at least some part of the portion represented as dielectric 3 is nonuniform with respect to conductive surface 2. There could be plural instances of nonuniform dielectric 3, and the shapes, dimensions, and positions of dielectric 3 proximate to surface 2 could vary and differ, and could be critical to optimizing electrical performance of conductor 1, for example as discussed for FIGS. 1a–1c.

Alternatively, dielectric 4 might cover only those portions of surface 2 that are not covered by dielectric 3; in this case, both dielectric 4 and dielectric 3 would be nonuniform with respect to surface 2, so this case would be covered by FIGS. 1a–1c and associated descriptions. Alternatively, the positions of dielectric 3 and dielectric 4 could be interchanged where they meet, so that dielectric 4 goes over dielectric 3 and dielectric 3 remains adjacent to surface 2; if dielectric 3 has substantial height perpendicular to surface 2, then at least some of dielectric 4 would be substantially nonuniform, so some part of both portions of dielectric, dielectric 4 and dielectric 3, would be nonuniform with respect to surface 2, and this case would also be covered by FIGS. 1a–1c and associated descriptions.

As discussed below, instances of uniform dielectric 4 could be added anywhere to the examples of preferred embodiment structures as shown; thus, for example, various structural features described above for the FIG. 1d example could be combined, such that instances of uniform dielectric 4 could be on any or all sides of instances of nonuniform dielectric 3, including plural instances of distinct uniform dielectric 4 materials or layers on any side or sides of instances of nonuniform dielectric 3. Furthermore, as shown in FIGS. 1a–1c above, there could be plural instances of nonuniform dielectric 3. Therefore, it logically follows that, in accordance with the teachings and claims of the present invention, single or plural instances of nonuniform dielectric 3 could be added to prior art electrical devices or structures for carrying electricity, and could be added on any or all sides of various pre-existing instances of uniform dielectric 4, as well as any or all sides of any newly added instances of uniform dielectric 4.

Figure 1E:
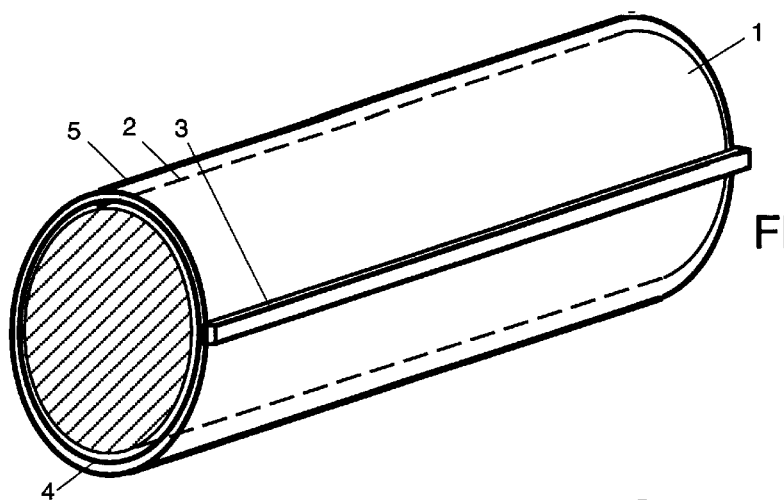

In FIG. 1e, a second conductor comprising conductive surface 5 is added. FIG. 1e shows an example of one possible configuration, with conductive surface 5 being interposed between conductor 1 and dielectric 3. In FIG. 1e conductor 1 could be the conductor carrying the voltage or current or signal of interest, whose performance is sought to be optimized. Conductive surface 5 could further aid in optimizing the performance of conductor 1. Conductive surface 5 could be uniform (as shown) with respect to the area of surface 2 of conductor 1, or it could be nonuniform. In the FIG. 1e example, dielectric 4 insulates conductor 1 from conductive surface 5, by occupying the space between conductor 1 and conductive surface 5. In this example, dielectric 4 is applied uniformly to surface 2 of conductor 1. In this example, dielectric 3 is employed nonuniformly proximate to conductive surface 5. Thus, dielectric 3 is still proximate to surface 2 of conductor 1, and is still nonuniform with respect to the area of surface 2, as well as with respect to conductive surface 5. If, in the FIG. 1e example, conductive surface 5 were to be closely spaced to conductor 1, then in accordance with the present invention it could be novel and advantageous to employ instances of nonuniform dielectric 3 outside the space between any plural closely spaced conductors that might be present.

It has been experimentally determined and demonstrated that, in this configuration, the nonuniform application of dielectric 3 can create performance advantages for proximate conductor 1, even with layers of dielectric 4 and conductive surface 5 intervening. Furthermore, it has been experimentally determined and demonstrated that, in this configuration, a selective nonuniform application of dielectric 3 can obtain superior performance for conductor 1 compared to a uniform application of dielectric 3, and also compared to no application of dielectric 3. Thus, the essence of the present invention has been vindicated for the type of structural configuration exemplified in FIG. 1e.

Figure 2A:
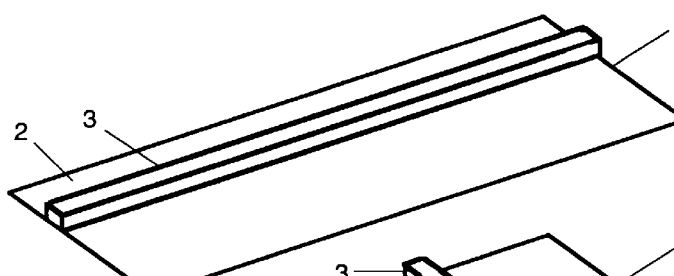
FIGS. 2a–2e show applications of the present invention to a flat planar conductor, in perspective view.
Figure 2B:
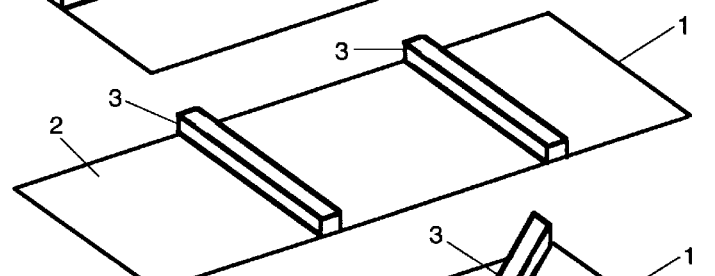
Figure 2C:
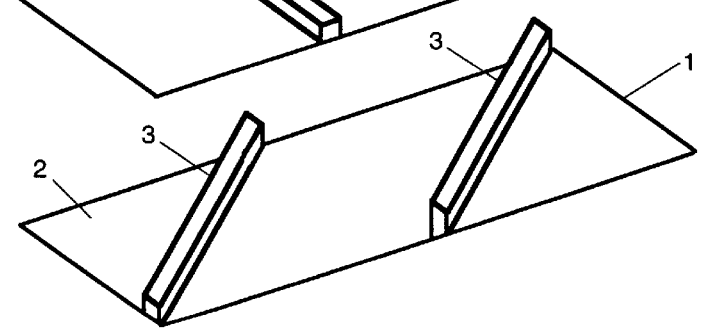

FIGS. 1a–1e show possible embodiments of the present invention employed with a conductor having a circular cross section. It is understood that the present invention also covers embodiments with conductors having other shapes and dimensions. If a conductor has a cross section that is polygonal (regular or irregular), then it could have plural surfaces (such as shown for FIG. 2a), and the present invention would apply to a dielectric substantially nonuniform with respect to any one of these plural surfaces. In some circumstances a conductor with an approximately round cross section could be said to have several sides or faces (e.g. top, bottom, left, right), so it could likewise have plural portions of conductive surface, with some surface portions being proximate to a given instance of nonuniform dielectric while other surface portions are away from this same given instance of dielectric. In accordance with the present invention, a portion of dielectric could be nonuniform with respect to the surface area of a proximate one of these conductive surface sides or portions. On the other hand, if a recognizably substantially single face or side merely is irregular by virtue of having a textured surface roughness (instead of being perfectly smooth), then it could still count as being a single conductive surface for purposes of the present invention.

In accordance with the present invention, a nonuniform dielectric could be employed for an electrical cable, in certain restricted ways or structural configurations, to provide advantageous performance and be distinct over prior art. An electrical cable could comprise a substantially isolated conductor, and/or plural closely spaced conductors, perhaps with one or more dielectrics insulating those conductors. Consider an example of a cable where the outermost conductor of the cable substantially surrounds another closely spaced conductor or conductors of the cable, thus substantially enclosing interior conductors. In accordance with the present invention, it could be novel and advantageous to employ a portion of nonuniform dielectric outside the space enclosed by the outermost such closely spaced conductor. Likewise, in a cable comprising two or more closely spaced conductors where no one conductor completely encloses another conductor, it could be novel and advantageous, in accordance with the present invention, to employ a nonuniform portion of dielectric outside the space between these closely spaced conductors (see discussion below for FIG. 3a, where an example of two closely spaced conductors is shown).

This nonuniform dielectric could be nonuniform with respect to the surface of the outermost conductive surface, for example in the case where one conductor substantially encloses another conductor, or with respect to any of the conductive surfaces within the cable. In such embodiments, the present invention could employ the same possible structural configurations as for example in FIGS. 1a–1e, where nonuniform dielectric 3 is employed proximate to conductor 1, but applied instead to an electrical cable. In accordance with the present invention, it could be novel and advantageous to employ instances of nonuniform dielectric 3 outside the space between any plural closely spaced conductors that might be present within an electrical cable.

Figure 1F:
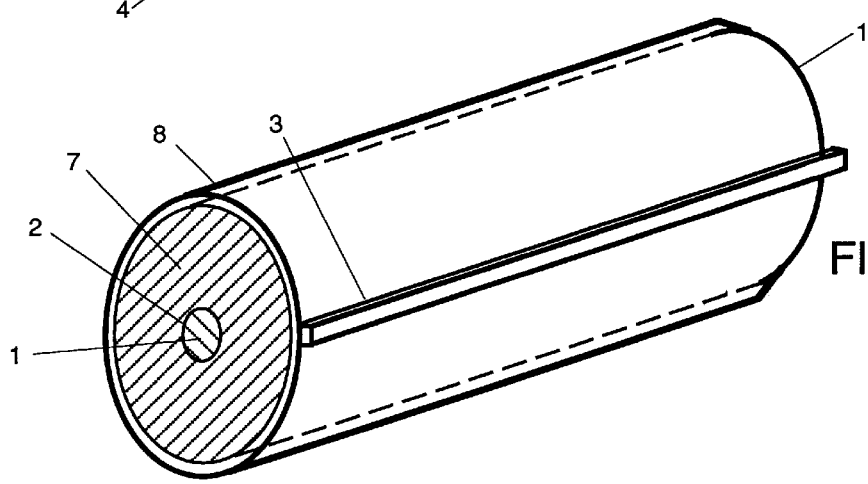

FIG. 1f shows an electrical cable in perspective view. This cable comprises conductor 1 and a cable remainder 7, which could comprise an assortment of dielectrics and one or more further conductors. Thus, FIG. 1f illustrates, a possible example of a conductor system, containing a number of conductors or conductor elements. In the FIG. 1f example, conductor 1 and cable remainder 7 are substantially enclosed by an outermost conductive surface 8, which in this example could be closely spaced to conductor 1 (e.g. if it has a substantial capacitive relationship with conductor 1 and conductor 1 is a conductor of interest for this capacitive relationship). Conductive surface 8 is shown as a separate element for clarity, but it could be structurally contiguous with other elements that are part of cable remainder 7. As the art recognizes, conductive surface 8 could represent a shield for cable remainder 7, and this shield could itself comprise a single conductor element (as in a solid shield) or plural conductor elements (as in the braided or helical shield designs commonly practiced by the art); for purposes of the present invention, any enclosing shield design can be considered as equivalent to an enclosing conductor having a surface such as conductive surface 8. In accordance with the present invention, if outermost conductive surface 8 is closely spaced to some other conductor within this cable, it could be novel and advantageous to employ instances of nonuniform dielectric 3 outside outermost conductive surface 8.

Dielectric 3 could be nonuniform with respect to outermost conductive surface 8, or with respect to surface 2 of conductor 1 (if it is nonuniform with respect to one, then it would likely be nonuniform with respect to the other). The nonuniformity of dielectric 3 could benefit the electrical performance of conductor 1, or any other conductors within the cable, so the nonuniformity with respect to a proximate conductive surface is still an operative essence of the present invention, even though in this case the nonuniformity with respect to the outermost conductor's conductive surface might be easier to visually observe.

FIGS. 2a–2e show examples of possible embodiments where conductor 1 is a thin flat planar conductor, for example a planar conductor on a substrate for printed wiring or printed circuits. Here a conductive surface could be defined as just one side of a thin flat planar conductor, and the other side could be a different conductive surface, there being a sharp corner between the two surfaces. Thus, the present invention would apply even if a proximate dielectric were nonuniform with respect to the area on only one side of a flat planar conductor (if it is nonuniform with respect to one side, then it would likely be nonuniform with respect to the other). Similarly, if conductor 1 in FIGS. 1a–1d were hollow, it would have at least two conductive surfaces, and the present invention would apply even if a proximate dielectric were nonuniform with respect to the area on only one side of this hollow conductor.

FIGS. 2a–2e parallel FIGS. 1a–1e respectively, and similar considerations apply as have been described for FIGS. 1a–1e. The structural features discussed for FIGS. 1a–1e above could be applied to the FIGS. 2a–2e examples, and/or combined with the features shown in FIGS. 2a–2e, in a straightforward manner. For example, FIG. 2e already shows an example with plural planar conductors, such as might be present on a two sided or multilayer printed circuit substrate, perhaps within an integrated circuit module. As discussed for FIG. 1d, uniform dielectric 4 could be on any or all sides of instances of nonuniform dielectric 3, including plural instances of distinct uniform dielectric 4 materials or layers on any side or sides of instances of nonuniform dielectric 3. Furthermore, as shown in FIGS. 1a–1c above, there could be plural instances of nonuniform dielectric 3. Therefore, it logically follows that, in accordance with the teachings and claims of the present invention, single or plural instances of nonuniform dielectric 3 could be added to prior art electrical devices or structures for carrying electricity, and could be added on any or all sides of various pre-existing instances of uniform dielectric 4, as well as any or all sides of any new instances of uniform dielectric 4.

Figure 2D:
Figure 2E:

It is noted that, of the plural conductors shown and exemplified in FIG. 2e, some might each be a substantially isolated conductor, and/or some might be plural closely spaced conductors. The art recognizes the factors determining which they are, as discussed above (factors such as substantial capacitance with another conductor of interest, which in turn are determined by recognized variables such as distance, circuit parameters, manner of electrical connection, etc.). FIG. 3c below shows one example where pluralities of both types of conductors, closely spaced and substantially isolated, could coexist in the same electrical device or structure for carrying electricity. If some conductors in a structure such as exemplified by FIG. 2e are closely spaced conductors, then in accordance with the present invention it could be novel and advantageous to employ instances of nonuniform dielectric 3 outside the space between these closely spaced conductors.

A basic capacitor could comprise two conductors, closely spaced such that their capacitance is a matter of interest, these conductors being separated by a dielectric interposed between them. The volume of space between these two conductors is clearly delimited by the edges or boundaries of these plural conductors. Under the present invention it could be novel and advantageous for a dielectric, disposed outside the space between a closely spaced pair of conductors and proximate to their surfaces, to be nonuniform with respect to the area of these conductive surfaces. It can be appreciated that the present invention would likewise also apply to a nonuniform dielectric disposed outside the space between two closely spaced conductors, regardless of the shape of these conductors and of their conductive surfaces (for example, the conductors could be round [as shown in FIGS. 1a–1c] or rectangular in cross section, instead of flat as shown in FIG. 3a, with the volume of space between them still being delimited by the edges or boundaries of the plural conductors).

FIGS. 3a–3e show some possible embodiments of the present invention, as applied to a capacitor. As the art recognizes, a capacitor includes electrical devices and structures for carrying electricity where there is substantial capacitance of interest between plural conductors of interest (e.g. extended distributed capacitors such as strip lines and transmission lines).

Figure 3A:
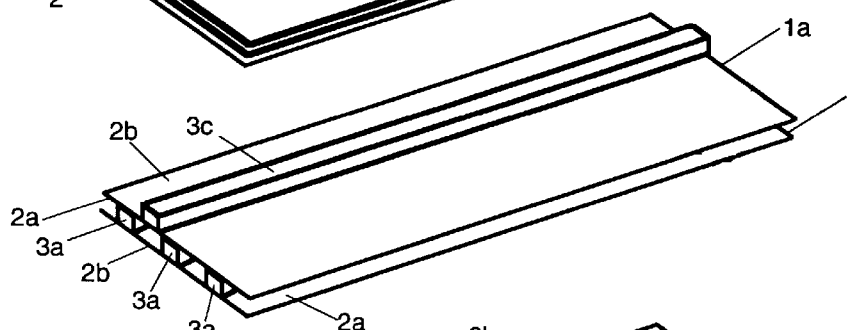
FIG. 3a shows an application of the present invention to a basic capacitor, in perspective view.

FIG. 3a shows a basic capacitor, comprising two flat planar conductors 1a and 1b, commonly called plates. Each plate could be said to have two sides, hence two conductive surfaces 2a (the inside oppositely facing surfaces) and 2b (the outside surfaces), as shown, though in practice most capacitor plates are so thin that each plate could also be regarded as simply being a single conductive surface (the choice of nomenclature here is not crucial, since under the present invention it is sufficient for a nonuniform dielectric to be proximate to a conductive surface, not necessarily adjacent). In FIG. 3a, dielectric 3a is shown nonuniformly disposed between the facing pair of plates, and additionally dielectric 3c is shown nonuniformly disposed outside of the space between the facing pair of plates. Either or both of these applications of nonuniform dielectric 3 could be advantageous. The dielectric 3a between a facing pair of plates could be different in some way (composition, disposition, etc.) from the dielectric 3c outside the space between a facing pair of plates, presumably to optimize performance for each. It can be appreciated that FIG. 3a shows a portion of dielectric inside the space between two closely spaced conductors, and a portion of dielectric outside the space between closely spaced conductors. If at least some part of the latter portion of dielectric is substantially nonuniform with respect to a surface of either conductor 1a or conductor 1b (or both), then the structure is distinct over prior art and is in accordance with the present invention.

Figure 3B:
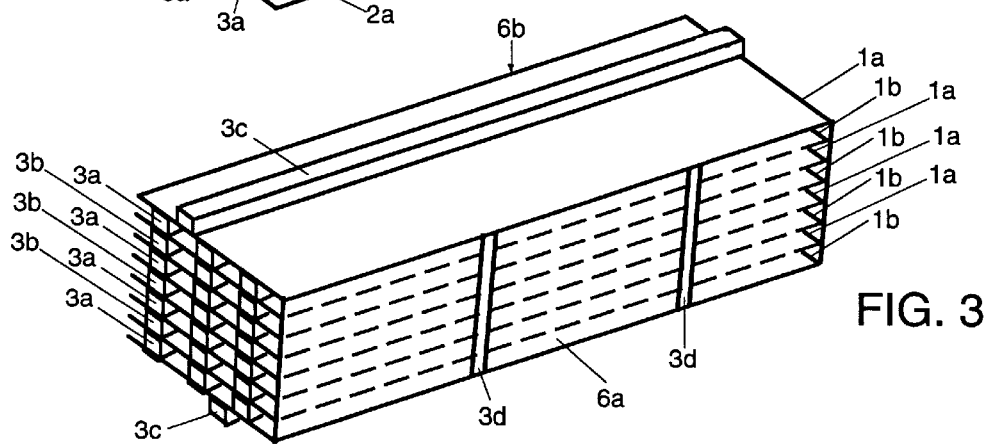
FIG. 3b shows an application of the present invention to a multiple plate capacitor, in perspective view.
Figure 3C:
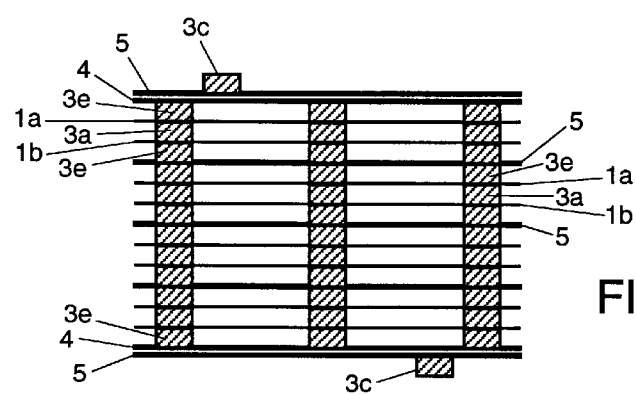
FIG. 3c shows another application of the present invention to a multiple plate capacitor, in elevation view.

FIG. 3b shows one possible embodiment of a practical stacked multiple plate capacitor. The array of plates comprises paired, oppositely facing flat planar conductors 1a and 1b. In FIG. 3b, like FIG. 3a, dielectric 3a is shown nonuniformly disposed between each facing pair of plates, and dielectric 3b is shown nonuniformly disposed outside of the space between each facing pair of plates, but within the space of the capacitor plate array. Additionally, dielectric 3c is shown nonuniformly disposed outside the space of the capacitor plate array, and proximate to the outermost plate conductive surfaces.

It is generally beneficial for a multiple plate capacitor to employ an additional conductor 6a which connects the plate 1a of each plate pair in common to every other plate 1a, and an additional conductor 6b which connects the plate 1b of each plate pair in common to every other plate 1b. Conductors 6a and 6b are typically conductive surfaces, in the form of conductive end sprays covering two sides on the outside of the plate array. FIG. 3b shows dielectric 3d disposed outside the space of the capacitor plate array, and proximate to conductive surfaces 6a and/or 6b, and nonuniformly disposed with respect to the area of a conductive surface to which it is proximate. It is noted that each instance of nonuniform dielectric 3d as shown has, within its contiguous extent, varying proximity to the surface or surfaces of a conductor of interest, plate 1a and/or 2a, and is therefore also nonuniform with respect to these conductive surfaces.

FIG. 3c adds the same types of elements to FIG. 3b as FIGS. 1d and 1e added to FIGS. 1a–1c. These elements are optional uniform dielectrics 4 and optional additional conductive surfaces 5. Thus, FIG. 3c illustrates a possible example of a conductor system, containing a number of conductors or conductor elements. FIG. 3c shows a multiple plate capacitor in elevation view of one end.

FIG. 3c shows additional conductive surfaces 5 added outside of the spaces between facing plate pairs 1a–1b, both within and outside of the plate array. In this FIG. 3c example, nonuniform dielectrics 3e separate additional conductive surfaces 5 from plates 1a and 1b. For clarity, conductive end sprays 6a, 6b and any nonuniform dielectrics 3d are not shown in FIG. 3c. It is noted that, in the FIG. 3c example, some or all instances of conductive surfaces 5 might each qualify as a substantially isolated conductor—since they are located outside of the capacitance defining plate pairs 1a–1b, and thus might not contribute substantially to the capacitance of the capacitor, and therefore might not have a substantial capacitive relationship to another conductor of interest (depending for example on how they are electrically connected). Thus, FIG. 3c illustrates a possible example of an electrical device, a structure for carrying electricity, comprising both a substantially isolated conductor and also plural closely spaced conductors.

FIG. 3c shows uniform dielectrics 4 added at some locations where nonuniform dielectric 3 is already employed. A uniform dielectric 4 could be added anywhere to an electrical device or structure for carrying electricity, including locations where there is a nonuniform dielectric 3, or it could be substituted anywhere for a nonuniform dielectric 3. FIGS. 3a–3e merely exemplify some of many possible embodiments of the present invention. So long as a capacitor structure, or a structure comprising plural conductors, has one dielectric that is outside the space between closely spaced conductors and is nonuniform with respect to the area of a conductive surface to which it is proximate, it is in accordance with the present invention and distinct over prior art. It can be appreciated that nonuniform dielectrics 3a of FIGS. 3a–3c are located inside the space between plural closely spaced conductors, plate pairs 1a–1b sharing a capacitive relationship with each other as another conductor of interest. In contrast, nonuniform dielectrics 3c, 3d, and possibly 3e are located outside the space between plural closely spaced conductors. As such, these nonuniform dielectrics 3c, 3d, and possibly 3e are covered by the present invention.

Figure 3D:
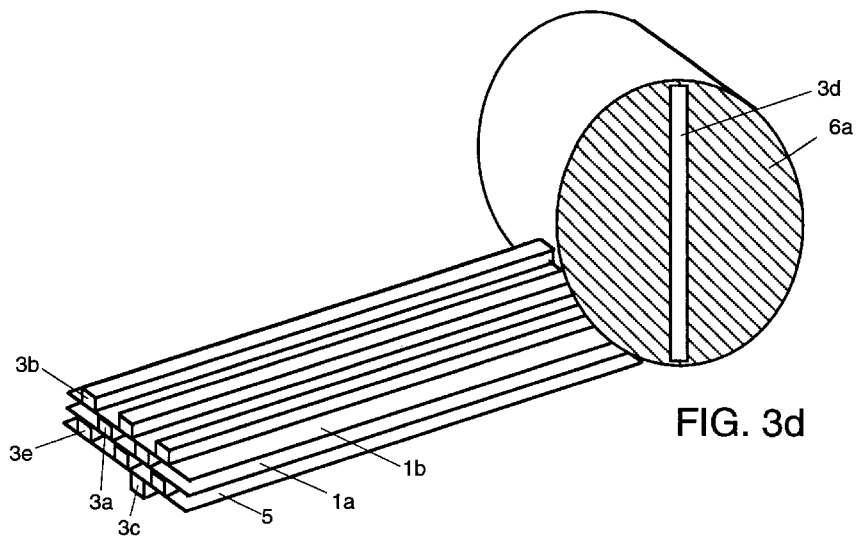
FIG. 3d shows an application of the present invention to a roll capacitor, in perspective view.

FIG. 3d shows one example of how a structure similar to the capacitor of FIG. 3c could be configured for a roll capacitor. FIG. 3d is also conceptually similar to FIG. 1f, in which a conductor system with an outermost conductive surface 8 is provided with a nonuniform dielectric 3. A sandwich structure, shown in staggered offset for clarity, is rolled up into a cylinder as shown. The sandwich structure example shown in FIG. 3d comprises: nonuniform dielectric 3c, added conductive surface 5, nonuniform dielectric 3c, plate 1a, nonuniform dielectric 3a, plate 1b, nonuniform dielectric 3b. When the sandwich structure as shown is rolled up, a portion of nonuniform dielectric 3c would be on the outside of the roll capacitor, with added conductive surface 5 being the outermost conductive element of the cylinder. If added conductive surface 5 were not employed, then plate 1a would be the outermost conductive element of the cylinder. After this sandwich structure is rolled up into a cylinder, conductive end sprays 6a, 6b could be applied to the cylinder ends, and dielectric 3d could then be employed proximate to these conductive surfaces, dielectric 3d being nonuniform with respect to the surfaces of conductive end sprays 6a and/or 6b. It is noted that each instance of nonuniform dielectric 3d as shown has, within its contiguous extent, varying proximity to the surface or surfaces of a conductor of interest, plate 1a and/or 2a, and is therefore also nonuniform with respect to these conductive surfaces.

Figure 3E:
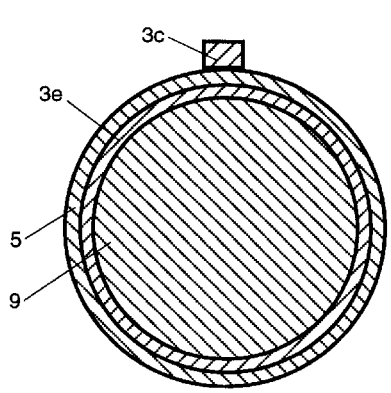
FIG. 3e shows another application of the present invention to a roll capacitor, in cross section view.

Many other configurations are possible for a roll capacitor. One example is shown in FIG. 3e, shown in cross sectional end view of the roll capacitor. A main capacitor body 9 comprises a rolled up sandwich structure, which comprises at least a pair of plates separated by a dielectric (which could be a uniform dielectric, or a nonuniform dielectric such as dielectric 3a). To make main capacitor body 9 for FIG. 3e, several elements could be deleted from the sandwich structure shown in FIG. 3d, so they would not be present within main body 9 of the capacitor: for example, nonuniform dielectric 3c, added conductive surface 5, and nonuniform dielectric 3e. These three elements could be added after the sandwich structure is rolled up into a cylinder, as the outermost layers of the finished roll capacitor, as shown in FIG. 3e. Again, a uniform dielectric 4 could be added anywhere, including locations where there is a nonuniform dielectric 3, or it could be substituted anywhere for a nonuniform dielectric 3. For example, the instance of nonuniform dielectric 3e shown in FIG. 3e could instead be an instance of uniform dielectric 4.

Figure 3F:
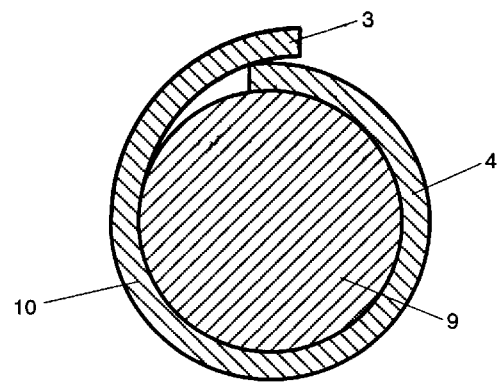
FIG. 3f shows another application of the present invention to a roll capacitor, in cross section view.

A portion of dielectric that is nonuniform could be a contiguous structural extension of a uniform dielectric, while still being nonuniform as defined by the present invention, namely substantially nonuniform with respect to the surface area of a proximate conductive surface. FIG. 3f illustrates one example of this.

FIG. 3f shows main capacitor body 9 in cross section view from the end of the roll capacitor. FIG. 3f shows a dielectric film 10 employed around the outside periphery of main capacitor body 9, extending somewhat more than 1 circumferential turn around this periphery. It can be appreciated that dielectric film 10 could be said to comprise two portions of dielectric (both portions being outside the space between plural closely spaced conductors): firstly a portion executing substantially 1 whole integral circumferential turn, which could be regarded as an instance of substantially uniform dielectric 4 (uniform because it uniformly covers substantially all of the capacitor's outermost conductive surface), and secondly a flap portion extending beyond a whole integral number of circumferential turns, which would be an instance of nonuniform dielectric 3 (being for example nonuniform with respect to the capacitor's outermost conductive surface). In the FIG. 3f example, both portions of dielectric are located outside any and all closely spaced conductors of the capacitor. At least some part of the flap second portion is substantially nonuniform with respect to the outermost conductive surface of main capacitor body 9. FIG. 3f is similar conceptually to FIG. 1d, in which conductor 1 with conductive surface 2 was covered by uniform dielectric 4, with nonuniform dielectric 3 as a strip adjacent to uniform dielectric 4.

It is noted that, even if contiguous dielectric film 10 were to be interpreted as being just one portion of dielectric, located outside the closely spaced conductors of the capacitor, it would still be true that at least some part of this portion of dielectric is substantially nonuniform, in accordance with the claims and teachings of the present invention. As can be seen in FIG. 3f, at least some part of this portion of dielectric is nonuniform by virtue of having varying proximity to a proximate conductive surface (e.g. the capacitor's outermost conductive surface), at different locations with respect to the area of this conductive surface. Furthermore, at least some part of this portion of dielectric is nonuniform by virtue of having substantially different thicknesses at distinct locations with respect to the area of this proximate conductive surface.

The flap comprising nonuniform dielectric 3 in the FIG. 3f example is a substantially nonuniform dielectric, representing a substantial variation or difference in the thickness of outside contiguous dielectric film 10. In the FIG. 3f example, the nonuniform flap portion is shown to be fully equally as thick as the uniform portion, which comprises only 1 circumferential turn; thus this flap represents a doubling of the thickness of the dielectric. In contrast, prior art capacitors have employed at least 3 complete circumferential turns of a substantially uniform outside wrap dielectric film or adhesive tape (each turn uniformly covering substantially all of the capacitor's outermost conductive surface); thus any contiguous flap section accidentally present, beyond an integral number of complete turns, has represented one fourth or less of the total thickness of that same dielectric film. Thus in prior art any accidental dielectric nonuniformity has been no greater than one third as thick as the aggregate thickness of the uniform outside section of that same material and same film. This is deemed to be an insubstantial nonuniformity, being a proportionally minor irregularity of the same contiguous material, and so will be called a uniform flap. For purposes of defining the present invention, a nonuniform portion of an outside portion of dielectric, when a contiguous structural extension of a uniform dielectric, shall be deemed to be substantially nonuniform if it is at least one half as thick as the aggregate thickness of the uniform and contiguous outside portion of that same contiguous dielectric. Thus, in accordance with the teachings and claims of the present invention, it could be novel and advantageous to provide a nonuniform contiguous flap (occupying a fraction of a turn less than 1 whole integral turn) in conjunction with two whole turns or fewer of a uniform and contiguous outside portion of that same contiguous dielectric.

Similarly, it is noted that some prior art capacitors with a uniform flap (as defined above) have employed, in addition to this uniform flap, a separate adhesive, such as a small glue strip or small piece of adhesive tape, no greater in area than the flap itself, to secure their flap. However, the sole utility of this separate adhesive has been as a flap securing means, with no electrical performance utility or advantage having been taught for any possible nonuniformity of such an adhesive. Prior art has limited this flap securing adhesive to being very small (no greater in area than the uniform flap, which itself is relatively so small that it does not qualify as a substantial nonuniformity, as discussed above). Also, prior art has limited this flap securing adhesive to being located only at the uniform flap. Furthermore, the art recognizes that an adhesive is a structurally distinct element from a dielectric, especially since some adhesives are conductive. It can be appreciated that the present invention teaches a nonuniform dielectric (possibly in the form of a nonuniform flap), not a flap securing means for a uniform flap, and furthermore teaches structures employing this nonuniform dielectric even where no flap securing means is needed, and/or even where no flap securing means is present. A dielectric film wrap, such as dielectric film 10 in FIG. 3f, might include an adhesive, since adhesives are not proscribed by the present invention, but in order to be novel and advantageous in accordance with the present invention, the structural feature of a substantial nonuniformity must be present, for example as the dielectric flap itself, with a relative thickness change sufficient to be substantial as defined above. Therefore, where a portion of dielectric outside plural closely spaced conductors has a contiguous flap that is uniform instead of nonuniform, as defined above, then any adhesive flap securing means (employed in conjunction with this uniform flap and distinct from the flap itself), whose small size and whose location only at the flap make it limited to having utility only as a flap securing means for this uniform flap (as in prior art), shall be deemed to be an insubstantial nonuniformity in itself, for purposes of defining the present invention.

The shape, dimensions, and/or location of the flap representing the nonuniform dielectric in FIG. 3f could be critical to optimizing the performance of the conductor or capacitor proximate to the dielectric, in accordance with the present invention—just as these parameters could be critical for the other configurations and embodiments of the present invention, such as those described above. This criticality has been confirmed experimentally for various configurations of the present invention, including the FIG. 3f configuration.

Figure 3H:
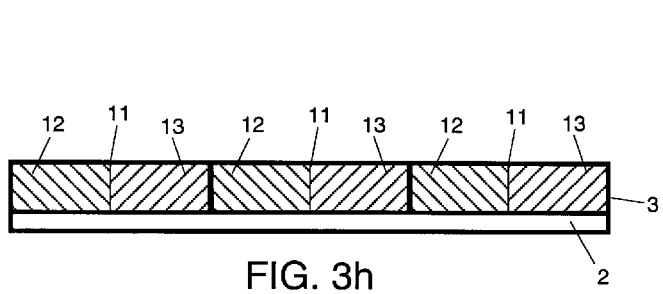
FIG. 3h shows another application of the present invention to a conductive surface, in cross section view.
Figure 3G:
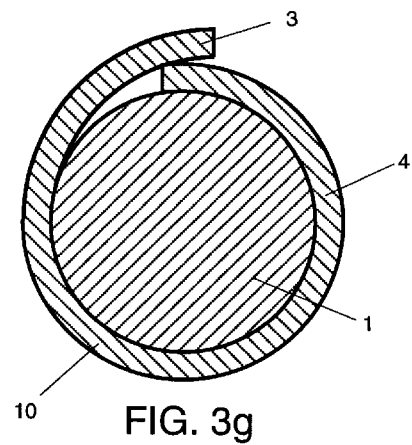
FIG. 3g shows another application of the present invention to a conductor, in cross section view.

FIG. 3g shows the same principle as FIG. 3f, but employed proximate to conductor 1 (or an electrical cable such as in FIG. 1f), instead of proximate to a capacitor. FIG. 3g is also similar conceptually to FIG. 1d, in which conductor 1 with conductive surface 2 was employed proximate to uniform dielectric 4 and nonuniform dielectric 3, and is also similar conceptually to FIG. 1f, in which conductor 1 and cable remainder 7 were employed proximate to nonuniform dielectric 3. The difference between FIGS. 1d, 1f and FIG. 3g is merely that, in FIG. 3g, nonuniform dielectric 3 is explicitly a contiguous extension of uniform dielectric 4, here in the form of a flap extending beyond an integral number of circumferential turns. In FIG. 3g, nonuniform dielectric 3 is substantially nonuniform because it passes the test of being one half as thick or thicker than the aggregate thickness of the uniform and contiguous outside portion of that same contiguous dielectric film.

The nonuniformity in dielectric 3 could be a very slight nonuniformity in an appropriate context, perhaps as little as one molecule, or even as little as an atomic scale nonuniformity in the structure of one molecule. For example, dielectric 3 could be employed in nonuniform clumps proximate to conductive surface 2. For some types of materials for dielectric 3, this could be accomplished via a method of application that has the convenience of uniform application but actually leaves a nonuniform dielectric in accordance with the present invention.

For example, it has been experimentally determined and demonstrated that, in accordance with the present invention, the electrical performance of a conductor can be improved by applying very thin, nonuniform deposits of a usefully advantageous substance to a conductive surface of this conductor, or in proximity to this conductor, as noted above. One method of applying such a substance is to mix (e.g. suspend or dissolve) slight amounts of it in a carrier fluid (e.g. aqueous or solvent based), and apply a thin, seemingly uniform coat of this mixture to the conductive surface; when the carrier evaporates, thin, nonuniform deposits of the substance remain on the conductor. Examples of such usefully advantageous substances include certain substances with large, complex molecules, and certain organic substances, and certain metal salts, and certain metal compounds.

These deposits could be nonuniform with respect to the conductive surface in a number of ways. For example, the dielectric material could be deposited in nonuniform clumps or have varying thickness, such as might be apparent under microscopic visual examination. Alternatively or additionally, the substantial nonuniformity might be present only on a scale involving arrangements among molecules or even involving merely the arrangement of atoms within each molecule. These molecular scale nonuniformities could be significant and substantial, for example if dielectric 3 were very thin, either uniformly or in some portions. Nonuniform dielectric 3 could be very thin, perhaps as thin as one molecule where it is present, and as thin as zero molecules where it is absent. Thus, dielectric 3 could be nonuniform simply by being present (even in small amounts) at some locations and absent at other locations, with respect to the area of a proximate conductive surface.

Most molecules comprise arrangements of atoms that are not uniform throughout the volume of each molecule. Most materials comprise arrangements of molecules, perhaps including various types of molecules, that are also not uniform throughout the volume of the material. These molecular scale nonuniformities usually average out in a thick dielectric material (e.g. with an unlatticed molecular structure) that is many molecules thick at all portions, for example greater than 100 molecules thick, so that such a material could be considered substantially uniform as a dielectric; this is the type of dielectric employed by prior art. However, if a dielectric material is made very thin, so that it is only a few molecules thick in at least some portions, then these molecular scale nonuniformities could remain significant and substantial for the dielectric as a whole. A dielectric that is less than 100 molecules thick at some location, its thickness being measured in a direction substantially perpendicular to a proximate conductive surface, shall, for purposes of the present invention, be deemed to be substantially nonuniform with respect to that proximate conductive surface, even if no other criteria or indicators of nonuniformity are present. Of course, if other criteria or indicators of nonuniformity are present, then a dielectric could be more than 100 molecules thick and still be nonuniform in accordance with the present invention.

FIG. 3h shows one such example of a dielectric that is substantially nonuniform on an atomic and molecular scale. FIG. 3h shows flat conductive surface 2 in elevation view of its edge. Nonuniform dielectric 3 is shown deposited adjacent to conductive surface 2, and is shown in a layer only one molecule thick for simplicity. As shown and discussed above for the present invention, nonuniform dielectric 3 could be deposited proximately to conductive surface 2 (perhaps with a uniform dielectric intervening), instead of adjacently as shown in this FIG. 3h example. A plurality of molecules 11 is shown in cross sectional elevation view. Nonuniform dielectric 3 comprises these molecules 11. Each molecule 11 is shown, for purposes of illustration, as comprising a portion 12 and a portion 13. Portions 12 and 13 have different atoms or arrangements of atoms. Thus each molecule 11 is shown as being nonuniform with respect to the surface area of conductive surface 2. If dielectric 3 were many molecules thick, this molecular nonuniformity with respect to the surface area of conductive surface 2 might be averaged out, to produce a substantially uniform dielectric on a macroscopic scale. Such a material in bulk might well have high resistance and be a good dielectric insulator. However, if dielectric 3 is merely a few molecules thick (for example less than 100 molecules thick), or merely one molecule thick such as shown in FIG. 3h, then it is substantially nonuniform with respect to the surface area of conductive surface 2.

Furthermore, if portion 12 were to comprise atoms which easily allow the exchange of free electrons, while portion 13 were to comprise atoms which do not easily allow the exchange of free electrons, then the portions 12 of each molecule 11 might allow substantially nonuniform dielectric 3 to behave more like a conductor than an insulator. The deposit of dielectric 3 could be sufficiently thin so that portions 12 could provide a free electron exchange path between conductive surface 2 and a measuring probe on the other side of dielectric 3. Thus a substance deposited as a thin dielectric 3 might act as a reasonably good conductor, even while the same substance in bulk might not provide a good path among portions 12, and thus could be a highly resistive insulator.

Dielectric 3, rather than comprising only one type of molecule (such as 11) with differing atomic portions to its structure, might instead comprise plural types of molecules. If such a dielectric were employed in a layer only one or a few (fewer than 100) molecules thick proximate to conductive surface 2, then it would clearly be substantially non-uniform with respect to conductive surface 2, since different molecules would reside at different locations proximate to conductive surface 2, and this nonuniformity would not be averaged out as it would be by a thick layer of such a dielectric substance.

The substantial nonuniformity for dielectrics 3 that are very thin in at least some portions, such as shown in FIG. 3h, could in some cases be confirmed by electrical tests. For example, it has been experimentally determined that, when an appropriate deposit of some usefully advantageous substance is made on a conductive surface in accordance with the present invention, its electrical behavior on the conductive surface could differ from its intrinsic electrical behavior in bulk or lump form. For instance, in one case, a substance which was highly resistive (more than 10,000 ohms) in bulk form (measured across a cubic centimeter) behaved substantially like a conductor when appropriately deposited on the surface of a conductor, with a resistance of less than 10 ohms.

One could infer substantial nonuniformity from this change in electrical behavior. As one example, it might be the case that the nonuniformity of deposited dielectric clumps had gaps, giving a large measuring probe some substantially direct access to the conductive surface (much as a measuring probe could have access in FIG. 2b to conductive surface 2 wherever there are no strips of non-uniform dielectric 3). Alternatively or additionally, it might be the case that the deposit of the dielectric is only one molecule or a few molecules thick in at least some portions, such that the nonuniform arrangement of atoms of the substance's molecules retains its nonuniform character for the thickness of the deposit, instead of being swamped and averaged out into uniformity by a thicker deposit with more molecular layers. Such a thin deposit, retaining its nonuniformity on an atomic and/or molecular scale, might allow passage of free electrons through some parts of its nonuniform structure, from the measuring probe to the conductive surface, thereby giving the measurement of good conductivity for the thin deposit even when the same substance in bulk measures high resistance. Thus, a substantial change in resistance, from bulk characteristics to the characteristic measured as deposited on a conductive surface, could be proof of a substantial nonuniformity in accordance with the present invention, even when that substantial nonuniformity might be on a scale too small to be visible. If the measured resistance characteristics of an employed thickness of employed substance change by a factor of more than 10 over its bulk characteristics (measured across a cubic centimeter), this should be taken as prima facie evidence that this substance as employed is substantially nonuniform, in accordance with the present invention, even if no other criteria or indicators of nonuniformity are present. If the employed thickness of the employed substance is to be employed adjacent to a dielectric rather than adjacent to a conductive surface, then this electrical nonuniformity test, for this employed thickness of employed substance, can be performed with a test sample of this employed thickness of employed substance placed adjacent to a test sample conductive surface.

Nonuniform clumps of dielectric 3 could be deposited proximate to conductive surface 2, with this nonuniformity being on a visible scale (perhaps under microscopic visual examination), and this nonuniformity could be combined with a further nonuniformity on a molecular or atomic scale, whereby some portions of these deposited clumps might be thin enough so that there is substantial nonuniformity on a molecular or atomic scale.

It is noted that FIGS. 3f, 3g show examples wherein a single contiguous dielectric may have both uniform portions (e.g. uniform portion 4) and nonuniform portions (e.g. nonuniform portion 3). Then FIG. 3h shows an example where the entire shown portion of dielectric 3 is nonuniform, but wherein individual sections 12 of the nonuniform portion are substantially different from adjacent sections 13, each such different section 12 or 13 thereby representing a nonuniformity in itself. In the FIG. 3h example, each section of the nonuniform portion of dielectric 3, i.e. each nonuniformity 12 or 13 itself, is shown as differing from its neighboring section by virtue of having a different material composition. In accordance with the above teachings of the present invention, each differing section of a nonuniform portion of dielectric, i.e. each nonuniformity itself, may differ from its neighbor by virtue of having substantially different material composition, or substantially different thickness, or substantially different shape, or substantially different dimensions, or substantially different proximity to the proximate conductive surface, or any combination thereof.

The various kinds of nonuniformity described above, and/or the various features of the various preferred embodiment examples shown and/or discussed above, could be combined in various ways, to produce further embodiments in accordance with the present invention. For a first example, the features of dielectric 3c as shown in FIG. 3d could be combined with the features of dielectric 10 as shown in FIG. 3f. Dielectric 3c as shown in FIG. 3d is a single contiguous dielectric that is located partially inside and partially outside the volume of space occupied by closely spaced rolled up conductors 1a and 1b, and dielectric 10 in FIG. 3f is a dielectric (outside a capacitor) comprising a uniform portion 4 as well as a nonuniform portion 3; combining these features could produce a single contiguous dielectric that is located partially inside the space between closely spaced conductors (either in a uniform or nonuniform manner), and then extends to be located partially outside the space between closely spaced conductors, this outside portion in turn perhaps comprising both uniform and nonuniform portions. At least some part of this outside portion could be nonuniform, thereby being in accordance with the claims and teachings of the present invention. For purposes of defining the present invention, a nonuniform portion of an outside portion of dielectric, when a contiguous structural extension of a uniform dielectric, shall be deemed to be substantially nonuniform if it is at least one half as thick as the aggregate thickness of the uniform and contiguous outside portion of that same contiguous dielectric. Thus, in accordance with the teachings and claims of the present invention, it could be novel and advantageous to provide a nonuniform contiguous flap (occupying a fraction of a turn less than 1 whole integral turn) in conjunction with two whole turns or fewer of a uniform and contiguous outside portion of that same contiguous dielectric.

For a second example, the features discussed for FIG. 1d could be combined with the features shown and discussed for FIG. 1e, and/or FIG. 1f, and/or FIG. 3c, and/or FIG. 3e. A uniform dielectric such as uniform dielectric 4 could be employed proximate to (even adjacent to), and on any or all sides of, nonuniform dielectric 3, as discussed for FIG. 1d, and likewise could be employed proximate to (even adjacent to), and on any or all sides of, a nonuniform dielectric such as nonuniform dielectric 3 in structures such as shown in FIG. 1e, and/or FIG. 1f, and/or FIG. 3c, and/or FIG. 3e.

For a third example, the features shown and discussed for FIGS. 2d and/or 2e could be combined with the features shown and discussed for FIG. 3c. It could be novel and advantageous, in accordance with the teachings and claims of the present invention, to employ instances of nonuniform dielectric proximate to a conductor or conductors on a substrate, as discussed for FIGS. 2d, 2e, even when the electrical device or structure for carrying electricity employs very complex configurations (such as shown and discussed for FIG. 3c), perhaps comprising plural conductors (some perhaps closely spaced and others perhaps substantially isolated) and perhaps comprising plural instances of uniform dielectrics in various locations. Thus, it could be novel and advantageous, in accordance with the teachings and claims of the present invention, to add instances of nonuniform dielectric proximate to the conductors of various prior art electrical devices and structures for carrying electricity, even very complex ones (e.g. integrated circuits, hybrid modules, or transistor arrays [comprising one or more transistors, including conductors for carrying electricity to and from their junctions]). In accordance with the present invention, these instances of nonuniform dielectric could be added anywhere on the outside of an existing prior art electrical device (perhaps also with further conductors such as conductor 5 and further uniform dielectrics such as uniform dielectric 4 being added), and/or they could be added anywhere on the inside of such a device, the only stricture being that the present invention teaches and claims novelty for nonuniform dielectric locations only outside the space between any plural conductors that qualify as closely spaced.

For a fourth example, any of the above features, singly or combined, could in turn be combined with the features shown and/or discussed in conjunction with FIG. 3h. The nonuniform dielectric employed in conjunction with any of the above features could involve a nonuniformity on a microscopic, molecular, or atomic scale, as determined by the criteria discussed above, this nonuniform dielectric being employed proximate to a conductor, possibly with other dielectrics (including uniform ones) and/or other conductors disposed in the intervening space.

As discussed above, the location, shape, and dimensions of each portion or instance of nonuniform dielectric could be critical, in order to provide optimum improvement of electrical performance.

Based on principles of geometry and mathematics recognized by the art, it can be appreciated that gauging the substantialness vs. insubstantialness of nonuniformity (or uniformity) naturally depends on the relative scale of the conductor and dielectric, and perhaps on their relative geometries as well. The examples of nonuniform dielectric shown above in preferred embodiments of the present invention generally feature a dielectric, or a nonuniformity within that dielectric, comparable in size to or smaller than the conductor surface, such that the dielectric's nonuniformity with respect to this conductor surface area can be defined, both geometrically and mathematically. For example, in the embodiments shown in FIGS. 1a–1f, each instance of nonuniform dielectric as a whole is smaller than the proximate conductor surface. Or, in the embodiment shown in FIG. 3h, the dimension of each nonuniformity itself (or differing section within the nonuniform portion of dielectric), within the dielectric as a whole, is smaller than the proximate conductor surface.

However, if some dielectric were much larger than a particular proximate conductive surface area, then its uniformity (or nonuniformity) with respect to that same surface area could perhaps not be thus well defined. The art recognizes that infinity divided by zero is mathematically undefined, and thus a nonuniformity cannot be well defined with respect to a proximate conductor surface if the dielectric is very much larger than the relevant proximate conductive surface or if the nonuniformity itself is substantially larger than the relevant proximate conductive surface. For example, in a possible prior art structure comprising a wide flat dielectric adhesive tape, with plural small wires attached thereto, the dielectric extends, with substantially uniform composition and dimensions, virtually out to infinity relative to the size of the proximate or adjacent surface portion of each small wire across its width dimension, so the uniformity (or nonuniformity) of such a large dielectric with respect to such a small proximate conductive surface portion would be mathematically defined by virtually infinity divided by virtually zero, which is undefined. Thus, in such a prior art structure the dielectric could not be well defined as being either uniform or nonuniform with respect to a proximate conductive surface, and therefore it could not be said to be substantially nonuniform in anticipation of the present invention.

A workable guideline could be to say that if a contiguous dielectric as a whole is no more than 10 times larger in a given dimension than a given proximate conductive surface portion, and if a nonuniformity itself within a dielectric is not substantially larger than a given proximate conductive surface area (e.g. as shown in the drawings), then it is geometrically and mathematically definable that this dielectric is nonuniform with respect to this same proximate conductive surface area—since the dimensions of each nonuniform section (comprising e.g. a difference in thickness or composition, including presence and absence) within this dielectric can then be mapped against or quantified with respect to this proximate conductive surface area.

This logically implies that neither of the two dimensions of the predominant surface area of the dielectric nonuniformity itself can be substantially greater than the corresponding dimensions of the proximate portion of conductive surface area with respect to which the nonuniformity is nonuniform, in accordance with the teachings of the present invention, so as to secure the electrical advantages for the conductive surface, from the conductive surface's viewpoint (the dielectric nonuniformity's predominant surface area being its largest contiguous outer surface area that is substantially or approximately parallel to the corresponding proximate conductive surface area—for example the top surface of each nonuniform section 12 or 13 in FIG. 3h, or the top surface of nonuniform dielectric 3c in FIG. 3e). It is noted that the words "with respect to" logically imply a mathematical division wherein the numerator (a dimension of the nonuniformity itself) is smaller than or comparable to the denominator (the corresponding dimension of the proximate conductive surface). If even one of the two dimensions of the predominant surface area of the nonuniformity itself were to be substantially greater than the corresponding dimension of the proximate conductive surface area, then the size of the nonuniformity could no longer be well defined from the conductive surface area's viewpoint, and thus the nonuniformity itself could not be well defined with respect to the proximate conductive surface area. This in turn logically implies, in the special case where a dielectric nonuniformity or nonuniform section completely encloses (in at least one dimension) the circumference or periphery of a conductor, that this dielectric nonuniformity or nonuniform section must be very thin (in a direction substantially perpendicular to the proximate conductive surface), as shown in FIGS. 1b, 1c, so that its outer circumferential or peripheral surface dimension is comparable to and not substantially greater than the corresponding circumferential or peripheral dimension of the enclosed conductive surface area underneath. On the other hand, in the more common case where a dielectric nonuniformity does not completely enclose a conductive surface, then each dielectric nonuniformity may allowably be substantially thicker, as shown in FIGS. 1a, 1d–1f, 2a–2e, 3a–3h.

Moreover, in the cases where a conductive surface is substantially flat, as shown in FIGS. 2a–2e, 3a–3c, 3h, then the boundaries of the conductive surface, with respect to which a dielectric variation is nonuniform across the area of this surface, are clear from mere inspection. For example, in FIG. 2a nonuniform dielectric 3 is a nonuniform section of dielectric, whose predominant surface area (its top surface area) has two dimensions: a length dimension and a width dimension. The length dimension of the predominant surface area of nonuniformity 3 is comparable to the corresponding length dimension of proximate conductive surface 2, and the width dimension of nonuniformity 3 is smaller than the corresponding width dimension of proximate conductive surface 2. Thus, both predominant surface area dimensions of nonuniformity (or nonuniform section) 3 are each not substantially greater than each corresponding dimension of the proximate conductive surface area. However, in those cases where a conductor has a total surface that is curved and continuous without a boundary, as in the case of round conductors as shown in FIGS. 1a–1f, 3e–3g, then the corresponding dimensions of the proximate conductive surface area might appropriately be more limited, for example being limited to that side or portion of the round conductor surface that is proximate to the dielectric nonuniformity instead of away from this dielectric nonuniformity (as discussed above in summarizing FIGS. 1a–1c).

The drawings show examples of various possible embodiments in accordance with the present invention, and all these examples show the dielectric nonuniformity itself being smaller than or comparable to, but not substantially larger than, the proximate conductive surface area, in both of the two dimensions that define the predominant surface area of the nonuniformity. In accordance with the above teachings, the claims of the present invention provide for designating or delimiting a portion of dielectric, then delimiting a portion of conductive surface that is proximate to this designated portion of dielectric, and then establishing that this designated portion of dielectric is indeed "nonuniform with respect to the surface area" of this delimited proximate portion of conductive surface, being "nonuniform" by virtue of any of the criteria taught above, and being, nonuniform "with respect to" the proximate conductive surface area by virtue of obeying the size restrictions logically imposed by the above teachings. It can be appreciated that some large size dielectric variations, apparent to the outside world, might be too large in size to qualify as a substantial nonuniformity with respect to the proximate portion of conductive surface area in accordance with the present invention (they would be so large in size that they would appear substantially uniform from the viewpoint of the smaller proximate conductive surface, and thus would not provide the electrical benefits for that conductive surface as taught by the present invention).

Each instance of nonuniform dielectric 3 might comprise one substance or plural substances. The several instances of nonuniform dielectric 3 proximate to one conductive surface 2 might comprise the same substance or substances as one another, or various substances or combinations of substances.

Any definitions or criteria given in this specification are possible illustrative examples, contributing to the description of some possible embodiments of the present invention. These definitions and criteria do not delimit the present invention, either inclusively or exclusively.

Although the present invention has been described in considerable detail in the above specification, it is not intended that the invention be limited to such detail except as necessitated by the appended claims or their legal equivalent.

I claim:

1. A method for providing an electrical device with improved electrical performance, said electrical device comprising a capacitor, said method comprising the step of providing a first conductor having a conductive surface, and the step of providing a second conductor closely spaced to said first conductor, and the step of providing a dielectric, said conductive surface having a first portion proximate to a portion of said dielectric, said first portion having a first surface area, said portion of said dielectric being situated substantially outside the space between said first and second conductors, said portion of said dielectric being substantially nonuniform with respect to said first surface area by virtue of having a characteristic selected from the group consisting of:

being present at a first substantial location with respect to said first surface area and absent at a second substantial location with respect to said first surface area, and having a substantially different shape at plural distinct locations with respect to said first surface area, and having a substantially different thickness at distinct locations with respect to said first surface area, and being employed with substantially different dimensions at plural distinct locations with respect to said first surface area, and having varying proximity to said first surface area at different substantial locations with respect to said first surface area, and employing different material composition at distinct substantial locations with respect to said first surface area, and being less than 100 molecules thick in a direction substantially perpendicular to said first surface area, and being present in a thickness wherein a first resistance measured through said thickness is less than one tenth a second resistance, of a substantially same substance as constitutes said dielectric, measured in bulk, and any combination thereof.

2. The method of claim 1 wherein said portion of said dielectric is also located outside any additional conductor, of said electrical device, that encloses said first conductor and is closely spaced to said first conductor.

3. A method for providing an electrical device with improved electrical performance, said method comprising the step of providing a first conductor having a conductive surface, and the step of providing a dielectric, said conductive surface having a first portion proximate to a portion of said dielectric, said first portion having a first surface area, said portion of said dielectric being substantially nonuniform with respect to said first surface area by virtue of having a characteristic selected from the group consisting of:

being less than 100 molecules thick in a direction substantially perpendicular to said first surface area, and being present in a thickness wherein a first resistance measured through said thickness is less than one tenth a second resistance, of a substantially same substance as constitutes said dielectric, measured in bulk, and any combination thereof.

4. An electrical device comprising a first conductor having a conductive surface, and a further structure, said further structure being selected from the group consisting of a first substructure and a second substructure, said first substructure comprising a dielectric, said conductive surface having a first portion proximate to a portion of said dielectric, said first portion having a first surface area, said portion of said dielectric being substantially nonuniform with respect to said first surface area by virtue of having a characteristic selected from the group consisting of, being less than 100 molecules thick in a direction substantially perpendicular to said first surface area, and being present in a thickness wherein a first resistance measured through said thickness is less than one tenth a second resistance, of a substantially same substance as constitutes said dielectric, measured in bulk, and any combination thereof;

said second substructure comprising a second conductor and a dielectric, said second conductor comprising an electrode of a capacitor, said second conductor being closely spaced to said first conductor, said conductive surface having a first portion proximate to a portion of said dielectric, said first portion having a first surface area, said portion of said dielectric being situated substantially outside the space between said first and second conductors, said portion of said dielectric being substantially nonuniform with respect to said first surface area by virtue of having a characteristic selected from the group consisting of:

being present at a first substantial location with respect to said first surface area and absent at a second substantial location with respect to said first surface area, and having a substantially different shape at plural distinct locations with respect to said first surface area, and having a substantially different thickness at distinct locations with respect to said first surface area, and being employed with substantially different dimensions at plural distinct locations with respect to said first surface area, and having varying proximity to said first surface area at different substantial locations with respect to said first surface area, and employing different material composition at distinct substantial locations with respect to said first surface area, and being less than 100 molecules thick in a direction substantially perpendicular to said first surface area, and being present in a thickness wherein a first resistance measured through said thickness is less than one tenth a second resistance, of a substantially same substance as constitutes said dielectric, measured in bulk, and any combination thereof.

5. The electrical device of claim 4 wherein said portion of said dielectric is also located outside any additional conductor, of said electrical device, that encloses said first conductor and is closely spaced to said first conductor.

* * * * *